United States Patent [19]

Kieser et al.

[11] Patent Number: 4,515,675
[45] Date of Patent: May 7, 1985

[54] MAGNETRON CATHODE FOR CATHODIC EVAPORTION APPARATUS

[75] Inventors: Jörg Kieser, Albstadt; Reiner Kukla, Hanau; Gerd Deppisch, Aschaffenburg, all of Fed. Rep. of Germany

[73] Assignee: Leybold-Heraeus GmbH, Cologne, Fed. Rep. of Germany

[21] Appl. No.: 624,940

[22] Filed: Jun. 27, 1984

[30] Foreign Application Priority Data

Jul. 6, 1983 [DE] Fed. Rep. of Germany ....... 3324248

[51] Int. Cl.³ .............................................. C23C 15/00
[52] U.S. Cl. .................................. 204/298; 204/192 R
[58] Field of Search ............................ 204/298, 192 R

[56] References Cited

U.S. PATENT DOCUMENTS

| 3,878,085 | 4/1975 | Corbani | 204/298 |
| 3,956,093 | 12/1974 | McCleod | 204/192 R |
| 4,198,283 | 4/1980 | Class et al. | 204/298 |
| 4,219,397 | 8/1980 | Clarke | 204/298 |
| 4,247,383 | 1/1981 | Greve et al. | 204/298 |
| 4,282,083 | 8/1981 | Kertesz et al. | 204/298 |

FOREIGN PATENT DOCUMENTS 2496126 6/1982 France .

Primary Examiner—Arthur P. Demers
Attorney, Agent, or Firm—Felfe & Lynch

[57] ABSTRACT

A magnetron cathode for cathodic evaporation apparatus with a target holder (10) for releasably securing a plate-like target (9). The associated magnet arrangement (7) has pole faces (7c, 7d) for producing at least one circumferentially closed tunnel of magnetic field lines which overlaps the target. The magnet arrangement (7) is accommodated in a housing of non-ferromagnetic material which extends over the pole faces. To increase the utilization factor of the target material without the pole faces or housing parts participating in the atomization process, (a) the projections of the target (9) and the pole faces (7c, 7d) in a common plane parallel to the target face (9a) do not intersect each other,
(b) in the zone of the pole faces (7c, 7d), the housing (16) is extended in the atomization direction in front of the target face (9a) or in the extreme case lies in the plane of the target face (9a), and
(c) the housing (16) together with the magnet system (7) is electrically insulated as regards both the target holder (10) and earth (4).

11 Claims, 3 Drawing Figures

MAGNETRON CATHODE FOR CATHODIC EVAPORTION APPARATUS

The invention relates to a magnetron cathode for cathodic evaporation apparatus and, more particularly, to such a magnetron cathode with a target holder for releasably securing a plate-like target and with a magnet arrangement having pole faces parallel to the target face for producing at least one tunnel of magnetic field lines, which is circumferentially closed and overlaps the target, the magnet arrangement being accomodated in at least one housing of non-ferromagnetic material which extends over the pole faces.

Magnetron cathodes having flat or outwardly curved target faces are quite well known. In these systems, a spatially defined arrangement of permanent magnets and/or electromagnets are provided in such a position relative to the target face that a circumferentially closed tunnel of magnetic field lines is produced above the target face, through which tunnel the glow discharge which brings about the atomization is limited to a zone directly adjacent the target and thus increases the rate of atomization by more than a decimal power. The term "target face" designates the effective target surface that is subjected to glow discharge and that extends from the atomized particles, i.e. generally from the front face of the target.

Magnetron cathodes of this kind can be equipped with permanent magnets as well as electromagnets so as to create the circumferentially closed tunnel. Static magnetic fields, such as are produced by permanent magnets lead, however, to inefficient exploitation of the target material since they cause deep erosion pitting in a very narrow zone in which the magnetic field lines extend parallel to the target face, and the major part of the target material adjacent these pitted areas remains unconsumed. This is a very serious disadvantage in the case of expensive target materials. Furthermore, during atomization and with the addition of reactive gases, electrically insulating coatings are usually formed in the non-eroded zone of the target and these may lead to undesirable charging and discharging.

DE-OS No. 27 35 525 discloses a system for increasing the utilization factor of the target material by widening the pits due to erosion. This is achieved by keeping the magnet system constantly in motion and displacing it parallel to the target face. This step, however, calls for a complicated form of magnetron cathode together with a suitable drive. It is known from DE-OS No. 25 56 607 to superpose an oscillating magnetic field on a stationary magnetic field, produced by permanent magnets, by means of a magnetic coil to which alternating frequency is applied, and in this way to widen the erosion pits and thus to increase the exploitation factor. The effect is relatively slight, however, since, with an electromagnet, it is not possible to produce a sufficiently strong magnetic field which, in conjunction with the permanent magnet system, would result in removal of the target material over a relatively wide area.

It is known from DE-OS No. 30 47 113 to eliminate the troublesome effects of erosion pitting on long-term atomization conditions by continuously increasing the spacing of the magnet system as consumption of the target material from its original front face proceeds. Here again, the utilization factor of the target material can be increased only to a slight extent.

U.S. Pat. No. 4,198,283 is also concerned with the problem of unfavorable utilization of the target material. In order to increase the utilization factor, the target, consisting of several portions, is clamped between soft magnetic pole shoes which to some extent constitute an elongation of the permanent magnets contained in a cooled housing made of non-ferromagnetic material. However, the utilization factor is increased only because the individual portions of the target can be reversed after partial consumption, so that other surface portions may also be subjected to the atomization process. However, the inspection of a magnetron cathode of this kind is rendered difficult by the frequent reversal of the target portions, and in addition cooling problems arise when the target portions, having been originally mounted to bear over a large area, turned and thus come into contact with the cooled housing through a surface in which the above-mentioned erosion pitting is present.

On the one hand, in the system in accordance with U.S. Pat. No. 4,198,283, the projections from the target and the pole faces of the permanent magnets located in the housing intersect each other, and on the other hand the tight encirclement of the target portions by the soft magnetic pole shoes again results in marked curvature of the magnetic field lines which lead to the known deep and narrow erosion pits. In addition, because of the extended soft magnetic pole shoes, there could also arise the danger of these pole shoes even being atomized together with the target material if this effect were not inhibited by a screen located at the ground potential.

DE-PS No. 30 04 546 and U.S. Pat. No. 4,282,083 describe magnetron cathodes wherein the projections of the target and pole faces of auxiliary magnets intersect each other. By superposing on the auxiliary magnetic fields thus produced, a main magnetic field, which is produced by pole faces which do not lie in the projection area of the target, the intention is to achieve a considerably increased utilization factor in the target material. Here again, apart from a very complicated construction of such arrangement, the pole faces (of the main magnet system) that do not lie in the projection of the targets are exposed to the atomization process so that, by providing special surface coatings, care must be taken to ensure that the coatings produced by the actual target material do not become contaminated by material from the magnet system. A grounded screen, which is also present, only prevents atomization of the exterior face or the housing of the cathode.

An object of the present invention is, therefore, to provide a magnetron cathode of the initially described kind which permits better utilization of the target without the pole faces or housing parts of the entire arrangement being involved in the atomization process.

This object is achieved by a combination of the following features:
(a) the projections of the target and the pole faces in a common plane parallel to the target face do not intersect each other,
(b) in the zone of the pole faces, the housing is extended in the atomization direction in front of the target face, or in the extreme case lies in the plane of the target face, and
(c) the housing together with the magnet system is electrically insulated as regards both the target holder and ground.

The expression "atomization direction" here means the direction of travel of the material, dusted off the target, towards the substrates disposed opposite the cathode. The "target face" means that face on which the actual atomization process takes place, i.e. the visible front face of the target.

The feature (a) creates the possibility of varying the relative positions of the target and the pole faces as seen in the direction of atomization, i.e. the pole faces may also lie at the side of the walls delimiting the target, without the need for providing special soft magnetic pole shoes for the purpose. In this way, the disposition of the magnetic field in relation to the target face can be intentionally influenced. With regard to the insulation spacing as in feature (c), it is even of particular advantage if the projections of the target on the one hand and of the pole faces on the other lie one within the other in a common plane parallel to the target face and in spaced relationship, i.e. by maintaining air gaps.

Since the pole faces no longer lie to the rear of the target but definitely outside the projection face of the target, the curvature of magnetic field lines in relation to the target dimensions that have to be covered by the field lines is considerably reduced, so that the width of the erosion pitting is correspondingly increased, with the result that utilization of material is considerably improved.

An additional advantage is obtained in the reactive atomization of metallic targets by combining features (a) and (b):

The target face is atomized over its entire area so that the creation of insulating surface coatings is effectively prevented. These coatings would result in a surface charge which would finally lead to a voltage flashover. Furthermore, feature (b) results in complete electrical screening of the lateral faces of the target, so that neither charging nor discharging can occur at these zones. Atomization of the lateral faces is effectively prevented.

Of very special advantage, however, is the uniform atomization of the target face in the case of extruded targets or those having poor thermal conductivity. Because of the uniform energy input, distortion of the target by stresses caused by heat does not occur. Extension of the housing also provides the possibility of displacing the pole faces within the housing and therefore of adjusting the position of the magnetic field relatively to the target face.

Extension of the housing also provides the possibility of displacing the pole faces within the housing and therefore of adjusting the position of the magnetic field relatively to the target face.

The step of preventing the projections of the targets and the pole faces from intersecting each other in a common plane of necessity endangers the pole faces and even results in the risk of their becoming atomized. For the purpose of inhibiting this atomization, it is in principle feasible to connect the central magnet as an anode (earth potential), but for reasons of insulation, this results in an air gap, constituting a magnetic resistance, in the zone of the magnet yoke (U.S. Pat. No. 4,282,083).

Furthermore, such a step results in a very strong electrical field between the magnet system and the target, which field promotes the creation of glow discharges in the zone of the gap. Although glow discharges in air gaps are described as desirable in U.S. Pat. No. 4,391,697, such a step again calls for the provision of special materials on the base of the air gap so as to prevent contamination of the coatings, deposited from the target material, by foreign material coming from the gap. Furthermore, as is well known, during atomization a considerable part of the electrical power supplied to the atomizing equipment is released in the anode in the form of heat. The use of the magnet system as an anode therefore necessitates the provision of an additional cooling system for protecting the magnet system.

In this connection the step in accordance with feature (c) provides the remedy of electrically insulating the housing and the magnet system with respect to the target holder as well as to earth. By means of this step, the housing and the associated magnet system can be automatically adjusted to an intermediate potential while maintaining the field-line geometry necessary for the magnetron principle, so that both atomization and bombardment with high-energy secondary electrons which contribute decisively to the heating of the anode, are suppressed. Certain constructional requirements must, of course, be met before this measure can be carried out, since normally the housing in which the magnet system is accomodated forms what is called a "cathode foundation", which serves as a carrier element for all of the cathode components and therefore is itself at cathode potential (U.S. Pat. No. 4,198,283; DE-OS No. 28 24 289; U.S. Pat. No. 4,385,579; DE-OS No. 30 47 113; DE-OS No. 25 56 607). This normal construction must be abandoned in order to obtain double insulation as provided for in the present invention.

According to a further feature of the invention, it is particularly advantageous if at least one air gap is present between the housing and the target in the direction parallel to the target face, which air gap is preferably (and in contrast, for example, to the teaching of U.S. Pat. No. 4,198,283) marked out and has a dimension of several millimeters. Uniformity of erosion of the target is, to a large extent, independent of the width of this air gap so that the cathode is also protected during long-term operation against contamination within this air gap.

The invention also relates to a magnetron cathode having a magnet yoke which interconnects the antipoles of the magnet arrangement and at the same time serves as a carrier element for the target and for the housing and the magnet arrangement. According to a further feature of the invention, such magnetron cathode is characterized in that the target, the target holder and its electrical supply lead are insulated from the magnet yoke.

This is achieved in a particularly advantageous manner in that the magnet yoke is in the form of a plate, and has on one of its flat faces circumferentially closed support faces for the magnet arrangement and comprises a plate-like insulating member, and in that a target cooling system rests on the insulating member.

Advantage also accrues if the pole faces are set back from the end face of the housing to an extent at least equal to the wall-thickness of the housing at this point. This set-back is preferably more than the wall-thickness of the housing, so that a cavity is formed between the pole faces and the end face of the housing. A further soft magnetic member can be accomodated in this cavity, preferably with an air gap surrounding this member. The air gap present at this point is divided by this soft magnetic member into two air gaps, and the spatial position of the soft magnetic member enables the magnetic field lines to be spread so that some of them penetrate the target and others pass over it. This step also contributes to the removal of material from the target face in a uniform manner.

In accordance with the invention, a magnetron cathode for cathodic evaporation apparatus comprises a target holder for releasably securing a plate-like target having a target face and magnet means having pole faces parallel to the target face for producing at least one tunnel of magnetic field lines, which is circumferentially closed and overlaps the target. The magnetron cathode also includes at least one housing for the magnet means, the housing being of non-ferromagnetic material which extends over the pole faces. The projections of the target and the pole faces in a common plane parallel to the target face are non-intersecting with respect to each other. In the zone of the pole faces, the housing is extended in the atomization direction at least to the plane of the target face. The housing together with the magnet means is electrically insulated as regards both the target holder and ground.

For a better understanding of the present invention, together with other and further objects thereof, reference is made to the following description, taken in connection with the accompanying drawings, and its scope will be pointed out in the appended claims.

A form of construction of the subject matter of the invention will now be described in greater detail by reference to FIGS. 1 to 3.

Figure 1:
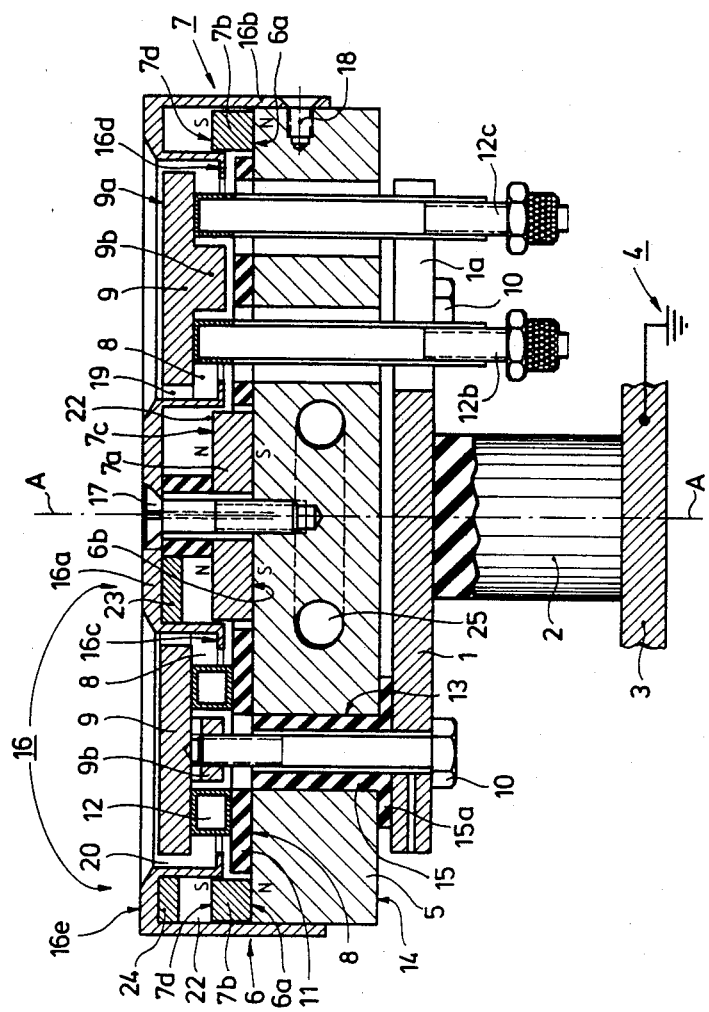
FIG. 1 shows an axial section through a substantially rotationally symmetrical magnetron cathode.

FIG. 1 shows a current-supply plate 1 which is connected by way of a supporting and insulating member 2 to a vacuum chamber 3 which is connected to ground 4. A magnet yoke 5, likewise substantially in the form of a plate, is firmly connected to the current supply plate 1 but is insulated therefrom. On its top side the magnet yoke has a flat face 6, in which are disposed circumferentially closed support faces 6a and 6b for a magnet arrangement 7. The magnet arrangement 7 consists of an inner ring magnet 7a and a closed outer row of bar magnets 7b which are all axially magnetized in relation to the axis A of the system, and in such manner that the direction of polarity of the inner ring magnet 7a is opposite to that of the outer bar magnets 7b. The pole position is clearly indicated in FIG. 1. At the side facing away from the magnet yoke 5, the magnet arrangement 7 has pole faces 7c and 7d which lie in a common plane.

Between the supporting faces 6a and 6b and between the pole faces 7c and 7d is a circumferentially closed supporting face 8 above which are arranged an insulating member 11 and a circular target 9 having a flat face 9a. According to the invention, and by appropriate choice of thickness of the insulating member 11, the target face 9a can be brought into a certain spatial position in relation to the pole faces 7c and 7d. The rear side of the target 9 is provided with a circumferential rib 9b in which are cut circumferentially distributed threads for receiving a number of draw-in bolts 10. By means of these bolts, the target 9 can be clamped against the magnet yoke 5 and the current-supply plate 1.

Figure 2:
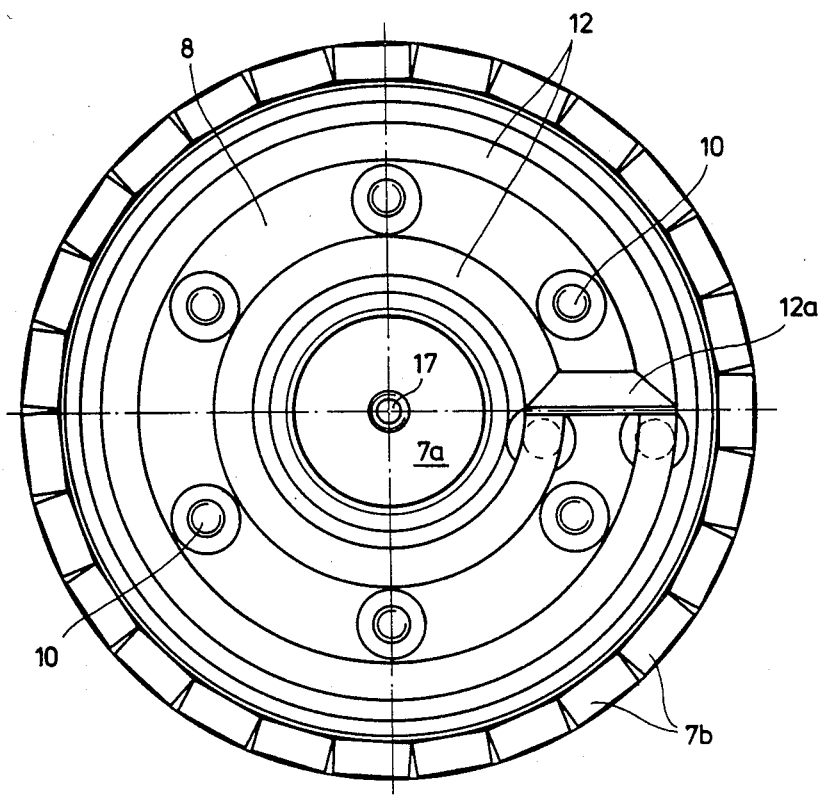
FIG. 2 is a plan view of the FIG. 1 magnetron cathode after the target and the housing parts of the magnet arrangement have been removed.

Located between the target and the insulating member 11 is a target-cooling system 12 which, as shown in FIG. 2, takes the form of a double wound tube which has two different radii and a square or rectangular cross-section, the axes of its individual turns lying in a common plane. The two turns are interconnected by a radially extending mitered tube portion 12a (FIG. 2). The opposite ends 12b and 12c are turned at right angles and, with adequate insulating gaps, are passed through bores (not shown) formed in the magnet yoke 5, or through a radial opening 1a in the current-supply plate 1.

When the draw-in bolts 10 are tightened, the target 9 is braced against its cooling system 12 which in turn is braced against the insulating member 11.

As can be seen from FIG. 1, a bore 13 runs from the flat face 6 to the opposite flat face 14 of the magnet yoke 5. The bore 13, shown in FIG. 1, represents one of a total of six such bores, through which six draw-in bolts 10 are passed, all of these being conductively connected to the target 9 on the one hand and to the current-supply plate 1 on the other.

To prevent short-circuiting between the current-supply plate 1 or the draw-in bolts 10 and the magnet yoke 5, a sleeve-like insulating member 15 is arranged in the bore 13, which insulating member has, outside the bore 13, a collar 15a bearing on the flat face 14. The current-supply plate 1 is braced against this collar by the force applied by the draw-in bolts 10.

It will be seen that in this way the current-supply plate 1 with the target 9 is electrically insulated from the magnet yoke 5 with the magnet arrangement 7 as well as from the vacuum chamber 3 and earth 4. Whereas the target 9 can be brought by way of the current-supply plate 1 to a definite negative potential, and earth 4 also represents a definite potential (zero potential), the magnet arrangement 7 with the magnet yoke 5 is free and can adjust itself to an intermediate potential which is determined by the operating conditions and upon the attainment of which the effect of inhibiting atomization of the magnet arrangement is automatically achieved within an extremely short time.

In the present case, the draw-in bolts 10 can be regarded as the target holding means. Whereas, with metallic targets, it is possible to anchor the draw-in bolts directly in the material of the target 9, in the atomization of, for example, dielectric targets, an arrangement can be used wherein a metallic ring, on which the dielectric target material is secured, is provided on the insulating member 11. This metallic ring then forms an efficient heat-conducting connection with the target cooling system 12 and furthermore takes up the mechanical forces which a brittle dielectric target would not be able to withstand. A cooling duct 25 in the magnet yoke 5 further increases the dissipation of heat.

The magnet arrangement 7 is contained in a housing 16 made of a non-ferromagnetic material. The housing 16 consists of two rotationally symmetric parts, i.e. of a cup-shaped central part 16a, which encloses the ring magnet 7a and is clamped to the magnet yoke 5 by a screw 17, and of an annular outer part 16b which, as seen in cross-section, surrounds the bar magnets 7b in an endless, i.e. closed, row and which is likewise secured to the magnet yoke 5 by means of several screws 18, only one of which is illustrated. The housing 16 has an end face 16e which consists of a circular face (of the housing part 16a) and of an annular face (of the housing part 16b) concentric with said circular face. Starting from this end face 16e the housing 16 is reduced to the rear of the target 9, i.e. in the zone of each of its inner edges it has a flange-like projection 16c, 16d, which is parallel to the end face 16e and which overlaps the plate-like insulating member 11 at least to such extent that it is not visible through the air gaps 19 and 20 (described hereinafter) between the target 9 and the housing 16.

It will also be seen that the two housing parts 16a and 16b, beginning at the end face 16b, overlie the magnets 7a and 7b i.e., their pole faces 7c and 7d, and in the form of two cylindrical rims, overlie the cylindrical inner face and the cylindrical outer face of the target 9, leaving two circular air gaps 19 and 20. The rim-like portions of the housing 16 can be regarded as parts of the air gaps 19 and 20, since they are made of non-ferromagnetic material.

The described covering of the insulating member 11 by means of the flange-like projections 16c and 16d effectively prevents, in the event of back-sputtering, the deposition of conductive material on the insulating member, which material would adversely affect the insulating properties of this member. In this connection it has to be borne in mind that the available spaces are relatively small so that the insulating properties must be maintained to a large extent even over fairly lengthy operating periods.

It will also be seen that the pole faces 7c and 7d are set back relatively to the end face 16e of the housing to an extent in excess of the wall-thickness of the housing at this point. In this way, cavities 21 and 22, in which soft magnetic elements 23 and 24 are accomodated, are formed between the pole faces 7c and 7d and the end face 16e of the housing. These soft magnetic members take the form of circles which are geometrically similar to the shape of the end faces of the housing. Thus, between the soft magnetic members 23 and 24 on the one hand and the pole 7c and 7d on the other, air gaps are formed which constitute a magnetic resistance and permit lateral emergence of magnetic field lines in the direction of the target 9. A further portion of the magnetic field lines of course emerges from the soft magnetic members 23 and 24 and consequently passes along slightly arcuate paths above the target face 9a. (The soft magnetic members 23 and 24 are illustrated only in the left-hand half of FIG. 1; they extend, of course, over the entire periphery of the axis A—A).

Figure 3:
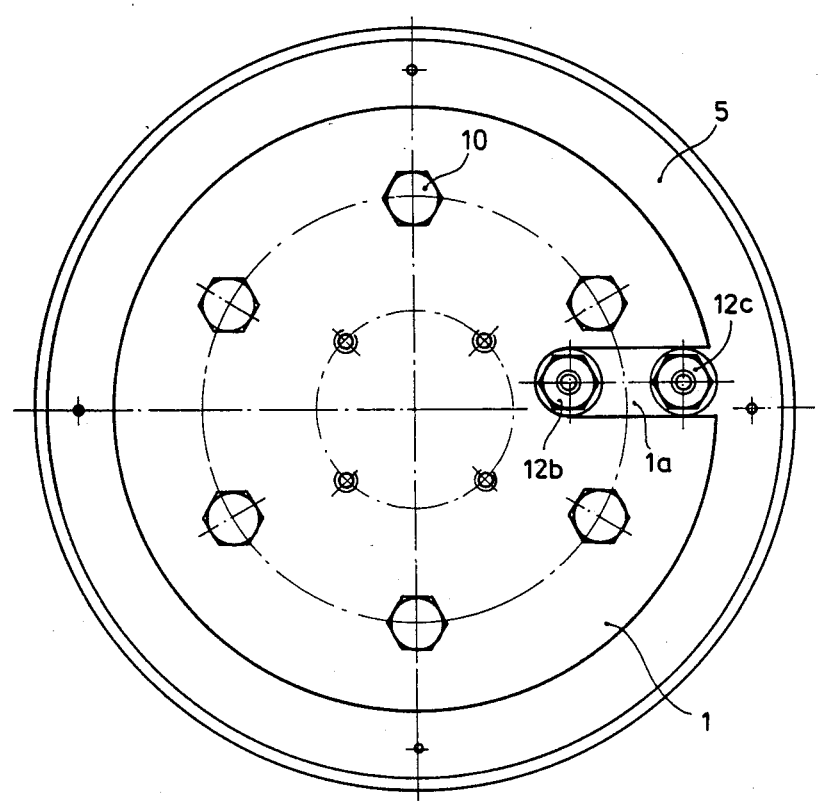
FIG. 3 is an underneath view of the FIG. 1 magnetron cathode.

The system in accordance with the invention is in no way restricted to the substantially rotationally symmetric arrangement illustrated in FIGS. 1–3; instead it can also be used with particular advantage in the case of elongate rectangular cathodes as used, for example, in the coating of large window panes. Such cathodes, with a width of approximately 30 to 40 cm, can readily have lengths of about 4 meters. Furthermore, all intermediate shapes, ranging from the circular to the rectangular, are feasible.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A magnetron cathode for cathodic evaporation apparatus, comprising:
   a target holder for releasably securing a plate-like target having a target face;
   magnet means having pole faces parallel to the target face for producing at least one tunnel of magnetic field lines, which is circumferentially closed and overlaps the target and;
   at least one housing for said magnet means, said housing being of non-ferromagnetic material which extends over the pole faces, the projections of said target and said pole faces in a common plane parallel to the target face being non-intersecting with respect to each other, in the zone of the pole faces said housing being extended in the atomization direction at least to the plane of said target face, and said housing together with said magnet means being electrically insulated as regards both said target holder and ground.

2. A magnetron cathode according to claim 1 in which said housing is extended in the atomization direction in front of said target face.

3. A magnetron cathode according to claim 1 in which said housing and said target have at least one air gap therebetween.

4. A magnetron cathode according to claim 3 in which said magnet means has antipoles and comprising a magnet yoke, which interconnects said antipoles of said magnet means and at the same time acts as a carrier means for said target and magnet means, said target being insulated from said magnet yoke.

5. A magnetron cathode according to claim 4 in which said yoke is in the form of a plate, and has on one of its flat faces circumferentially closed support faces for said magnet means and comprises a plate-like insulating member, and said cathode comprising target-cooling means in juxtaposition to said insulating member.

6. A magnetron cathode according to claim 5 in which said housing has an end face and, starting from its end face, said housing is indented to the rear of said target and at each of its inner edges is provided with a flange-like projection which is parallel to said end face and which overlies said plate-like insulating member at least to such an extent that said insulating member is not visible through said air gap between said target and said housing.

7. A magnetron cathode according to claim 2 in which said housing has an end face and a wall thickness, said pole faces are set back from said end face of said housing to an extent at least equal to the wall-thickness of said housing at this point.

8. A magnetron cathode according to claim 1 in which said housing has an end face and cavities formed between said pole faces and said end face of said housing, said cathode comprising soft magnetic member disposed in at least one of said cavities.

9. A magnetron cathode according to claim 8, in which said pole faces and said soft magnetic member have an air gap therebetween.

10. A magnetron cathode according to claim 1 in which the relative position of the target and the pole faces in the direction of atomization is determinable by the thickness of plate-like insulating members.

11. A magnetron cathode according to claim 4 in which said housing has an outer portion which overlies said magnet yoke.

* * * * *